United States Patent [19]

Chen

[11] Patent Number: 5,766,991

[45] Date of Patent: Jun. 16, 1998

[54] CMOS PROCESS UTILIZING DISPOSABLE SILICON NITRIDE SPACERS FOR MAKING LIGHTLY DOPED DRAIN

[75] Inventor: Teh-Yi James Chen, Cupertino, Calif.

[73] Assignee: U.S. Philips Corporation, New York, N.Y.

[21] Appl. No.: 705,072

[22] Filed: Aug. 29, 1996

Related U.S. Application Data

[63] Continuation of Ser. No. 539,090, Oct. 4, 1995, abandoned, which is a continuation of Ser. No. 400,775, Mar. 6, 1995, abandoned, which is a continuation of Ser. No. 72,672, Jun. 7, 1993, abandoned, which is a continuation of Ser. No. 758,436, Sep. 4, 1991, abandoned, which is a continuation of Ser. No. 522,433, May 11, 1990, abandoned.

[51] Int. Cl.$^6$ ............................................. H01L 21/336
[52] U.S. Cl. ........................ 438/231; 438/305; 438/307; 438/595
[58] Field of Search ........................ 437/168, 174, 437/188, 204, 216, 217, 395, 398, 401, 161, 162, 163, 164; 438/199, 230, 231, 232, 303, 305, 306, 307, 595; 257/336, 344, 351, 408, 900

[56] References Cited

U.S. PATENT DOCUMENTS

| | | | |
|---|---|---|---|
| 4,204,894 | 5/1980 | Komeda et al. | 437/44 |
| 4,382,827 | 5/1983 | Romano-Moran et al. | 437/34 |
| 4,488,351 | 12/1984 | Momose | 437/44 |
| 4,530,150 | 7/1985 | Shirato | 437/34 |
| 4,642,878 | 2/1987 | Maeda | 437/34 |
| 4,722,909 | 2/1988 | Parrillo et al. | |
| 4,728,617 | 3/1988 | Woo et al. | 437/44 |
| 4,740,484 | 4/1988 | Norström | 437/44 |
| 4,744,859 | 5/1988 | Hu et al. | 156/643 |
| 4,745,086 | 5/1988 | Parrillo et al. | |
| 4,753,898 | 6/1988 | Parrillo et al. | 437/44 |
| 4,760,033 | 7/1988 | Mueller | 437/34 |
| 4,764,477 | 8/1988 | Chang et al. | 437/57 |
| 4,808,544 | 2/1989 | Matsui | 437/44 |
| 4,818,714 | 4/1989 | Haskell | 437/34 |
| 4,818,715 | 4/1989 | Chao | 437/44 |
| 4,837,180 | 6/1989 | Chao | 437/44 |
| 4,843,023 | 6/1989 | Chiu et al. | 437/34 |
| 4,855,247 | 8/1989 | Ma et al. | 437/44 |
| 5,082,794 | 1/1992 | Pfiester et al. | 437/44 |

FOREIGN PATENT DOCUMENTS

| | | |
|---|---|---|
| 0218408 | 4/1987 | European Pat. Off. |
| 0157024 | 4/1981 | Japan . |
| 59-197161 | 11/1984 | Japan . |
| 60-167461 | 8/1985 | Japan . |
| 0241267 | 11/1985 | Japan . |
| 0160976 | 7/1986 | Japan . |

(List continued on next page.)

OTHER PUBLICATIONS

Huang et al, "Use of Sacrificial Spacers for Fabricating LDD Transistors in a CMOS Process," *Electronics Lett.*, 10 Apr. 1986, pp. 430–432.

Pfiester, "LDD MOSFET's Using Disposable Sidewall Spacer Technology", *IEEE Elec. Dev. Lett.*, Apr. 1988, pp. 189–192.

Use of Sacrificial Spacers for Fabricating LDD Transistors in a CMOS Process T.Y. Huang et al, Electronics Letters, 10 Apr. 1986, vol. 22 No. 8, pp. 430–432.

A Versitile High–Performance, Double–Level–Poly Double–Level–Metal, 1.2 Micron CMOS Technology, L.C. Parrillo et al, 1986 IEEE, IEDM 86, pp. 244–247.

*Primary Examiner*—Mary Wilczewski
*Attorney, Agent, or Firm*—Norman N. Spain

[57] ABSTRACT

A process sequence for fabricating CMOS devices of the LDD type includes forming spacers along the sides of gates defined on p- and n-regions of the device. In a two-mask sequence, a thin layer of silicon dioxide is utilized to protect the n-region spacers while the p-region spacers are etched away. In one-mask variants of this sequence, a thin layer of silicon oxynitride is utilized to prevent oxide growth over one type of region while an oxide implant mask is grown on the surface of the other type of region and on exposed surfaces of the gates overlying the other type of region.

6 Claims, 4 Drawing Sheets

FOREIGN PATENT DOCUMENTS

| | | |
|---|---|---|
| 61-295652 | 12/1986 | Japan . |
| 0118578 | 5/1987 | Japan . |
| 0173763 | 7/1987 | Japan . |
| 62-190862 | 8/1987 | Japan . |
| 0046773 | 2/1988 | Japan . |
| 63-219152 | 9/1988 | Japan . |
| 63-239858 | 10/1988 | Japan . |
| 1-7552 | 1/1989 | Japan . |
| 1-7553 | 1/1989 | Japan . |
| 1-84659 | 3/1989 | Japan . |
| 0132164 | 5/1989 | Japan . |
| 2197532 | 5/1988 | United Kingdom . |

CMOS PROCESS UTILIZING DISPOSABLE SILICON NITRIDE SPACERS FOR MAKING LIGHTLY DOPED DRAIN

This is a continuation of application Ser. No. 08/539,090 filed Oct. 4, 1995, now abandoned, which is a continuation of application Ser. No. 08/400,775, filed Mar. 6, 1995, now abandoned, which is a continuation of application Ser. No. 08/072,672, filed Jun. 7, 1993, now abandoned, which is a continuation of application Ser. No. 07/758,436, filed Sep. 4, 1991, now abandoned, which is a continuation of application Ser. No. 07/522,433, filed May 11, 1990, now abandoned.

BACKGROUND OF THE INVENTION

This invention relates to the fabrication of complementary metal-oxide-semiconductor (CMOS) integrated-circuit devices and, more particularly, to CMOS devices of the lightly doped drain (LDD) type.

As feature sizes in CMOS devices decrease to the micron and submicron range, so-called short-channel effects arise which tend to limit device performance. For the n-channel transistors in such a device, the major limitation encountered is caused by hot-electron-induced instabilities. To reduce these effects, LDD n-channel transistors have been proposed.

For the p-channel transistors in a short-channel CMOS device, the major limitation on performance stems from effects such as punch-through. To minimize this effect, relatively shallow junctions are required in the p-channel transistors.

Heretofore, disposable spacers made of various materials have been suggested as a basis for making LDD n-channel transistors in a CMOS device. Thus, for example, spacers made of polysilicon, silicon dioxide and silicon nitride have been proposed.

Moreover, known processes for making CMOS devices of the LDD type have formed the junctions in the n-channel and p-channel transistors in separate steps that involve decoupled annealing cycles. In that way, relatively shallow junctions can be formed in the p-channel transistors while independently annealing implant damage in the n-channel structures.

Priorly known processes of the type specified above are described, for example, in the following references: "Use Of Sacrificial Spacers For Fabricating LDD Transistors In A CMOS Process" by T. Y. Huang et al, *Electronics Letters*, vol. 22, No. 8, 10 Apr. 1986, pages 40–432; "LDD MOS-FETs Using Disposable Sidewall Spacer Technology" by J. R. Pfiester, *IEEE Electron Device Letters*, vol. 9, No. 4, April 1988, pages 189–192; U.S. Pat. No. 4,722,909; U.S. Pat. No. 4,745,086; European Patent No. 218,408; and United Kingdom Patent No. 2,197,532.

In the cited Huang et al article, disposable spacers are formed alongside the gates of a structure in which LDD CMOS devices are being fabricated. In a process sequence that employs either two or three one-layer masks, source and drain regions are defined in the structure.

Efforts have continued by workers skilled in the art directed at trying to further improve processes for making CMOS devices of the LDD type. In particular, these efforts have been aimed at trying to simplify the processes and thereby to decrease the cost of fabricating such devices. It was recognized that these efforts, if successful, could contribute significantly to the practical realization of low-cost high-performance devices having considerable commercial importance.

SUMMARY OF THE INVENTION

In accordance with the principles of the present invention, sidewall spacers are formed alongside both the n-channel and p-channel gates of a wafer containing p- and n-type regions that will be processed to form a CMOS device of the LDD type. A mask comprising a first protective layer and a second overlying resist layer is formed to cover the gate-spacer structures overlying the regions of one conductivity type and portions of the regions of the one conductivity type in which source/drain regions are to be formed and to leave uncovered the gate-spacer structures overlying the regions of the other conductivity type and portions of the regions of the other conductivity type in which source/drain regions are to be formed. Subsequently, exposed surface portions of the regions of the other conductivity type are implanted with dopant of the one conductivity type. With the first protective layer still in place, the gate-spacer structures that are not covered by the first protective layer are then modified.

In accordance with the invention, the spacers typically comprise layers of silicon dioxide directly adjoining the respective sides of the gates. Each spacer further typically includes a layer of silicon nitride formed in contact with the layer of silicon dioxide.

In one embodiment of the invention, the first protective layer of the aforementioned mask preferably comprises silicon dioxide. In that case, the gate-spacer structures are modified by removing the silicon nitride portions of the gate-spacer structures that are not covered by the first protective layer.

In other embodiments, the first protective layer preferably comprises silicon oxynitride. In that case, the gate-spacer structures are modified by growing a relatively thick layer of silicon dioxide on polysilicon surfaces of the gate-spacer structures that are not covered by the first protective layer as well as on surface portions of the ones of the p- and n-type regions that are not so covered.

BRIEF DESCRIPTION OF THE DRAWING

A complete understanding of the present invention and of the above and other features and advantages thereof will be apparent from the detailed description below taken in conjunction with the accompanying drawing, not drawn to scale, in which.

DETAILED DESCRIPTION

Figure 1:
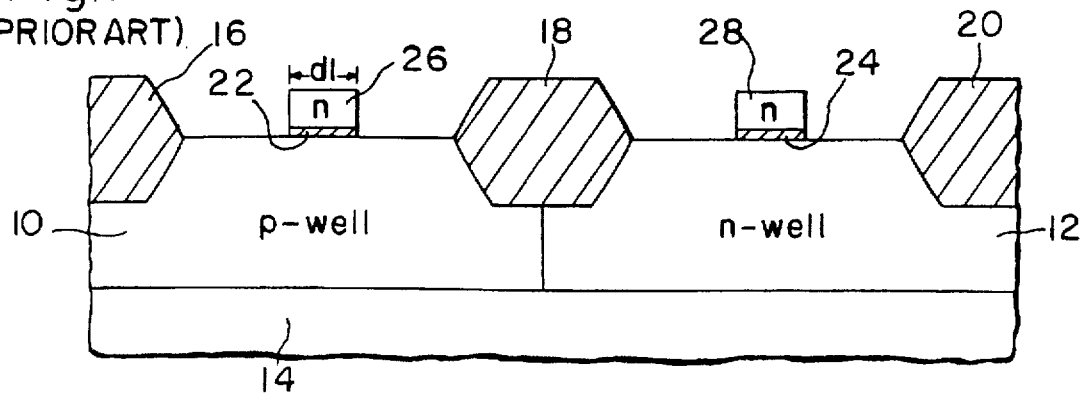
FIGS. 1 through 10 each constitute simplified cross-sectional depictions that represent specific illustrative steps in a fabrication sequence for making a CMOS device in accordance with the principles of the present invention.

FIG. 1 shows a portion of a partially fabricated conventional integrated-circuit device defined in a semiconductor wafer made of silicon. In particular, the depicted portion constitutes a part of a specific illustrative CMOS device at an intermediate point of its manufacture. In practice, multiple other such CMOS devices as well as other associated devices would typically be batch fabricated in the same wafer, as is well known in the art.

In FIG. 1, standard regions comprising, for example, a p-well or p-tub 10 and an n-well or n-tub 12 are shown formed in a silicon body 14. Field-oxide regions 16, 18 and 20 between adjacent wells constitute conventional recessed isolation regions made of silicon dioxide. The drawing shows these field oxide regions 16, 18 and 20 as separate zones in the cross-section. In reality the field oxide regions 16, 18 and 20 all are parts of one large field oxide region. In accordance with the specific illustrative steps described below, an n-channel transistor will be formed in the p-well 10 and, laterally isolated therefrom by the field-oxide region 18, a p-channel transistor will be formed in the n-well 12.

The conventional structure depicted in FIG. 1 further includes gate-oxide regions 22 and 24 each made of silicon dioxide. By way of example, each of the regions 22 and 24 is about 10-to-20 nanometers (nm) thick.

Overlying the gate-oxide regions 22 and 24 of FIG. 1 are conventional heavily doped polysilicon gates 26 and 28, respectively. Illustratively, each of the gates 26 and 28 has a thickness of approximately 350-to-500 nm and is doped with an n-type impurity such as phosphorus or arsenic to exhibit a sheet resistance of about 20 ohms per square. The length d1 of each of the gates 26 and 28 is, for example, about one micrometer.

The exposed surfaces of the polysilicon gates 26 and 28 and of the silicon wells 10 and 12 shown in FIG. 1 are then oxidized at a temperature of, for example, about 900 degrees Celsius. Due to the relatively heavy doping of the gates 26 and 28, a layer of silicon dioxide about 60 nm thick thereby forms on their exposed surfaces, while at the same time a layer of silicon dioxide only about 30 nm thick forms on the exposed surfaces of the relatively lightly doped wells 10 and 12. Subsequently, in a standard low-pressure chemical-vapor-deposition (LPCVD) step, a layer of silicon nitride is deposited on the top surface of the structure. Illustratively, the thickness of the deposited silicon nitride layer is everywhere about 200 nm except for thicker sloped-wall portions thereof that lie to the sides of the gates 26 and 28. At that point, the structure appears as represented in FIG. 2 wherein the aforespecified oxide and nitride layers are designated by reference numerals 30 and 32, respectively.

Figure 2:
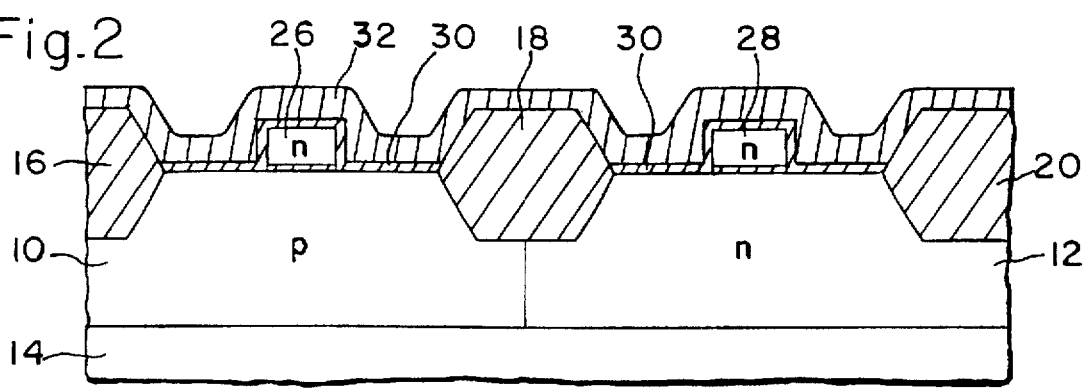

Next, in an anisotropic reactive-ion-etching (RIE) step, all of the nitride layer 32 of FIG. 2 except for the aforementioned relatively thick sloped-wall portions are removed. Further, exposed portions of the underlying oxide layer 30 are also thereby etched away. By way of example, this RIE step is carried out by utilizing a known plasma derived from a standard mixture of $CO_2$, $CHF_3$ and He. Such an etchant does not significantly affect the surfaces of the gates 26 and 28 and of the wells 10 and 12 that are thereby exposed. Advantageously, the structure is then subjected to a standard $O_2$ plasma, thereby to remove from the surface any polymer formed thereon during the RIE step. At that point in the fabrication sequence, the structure appears as shown in FIG. 3.

Figure 3:
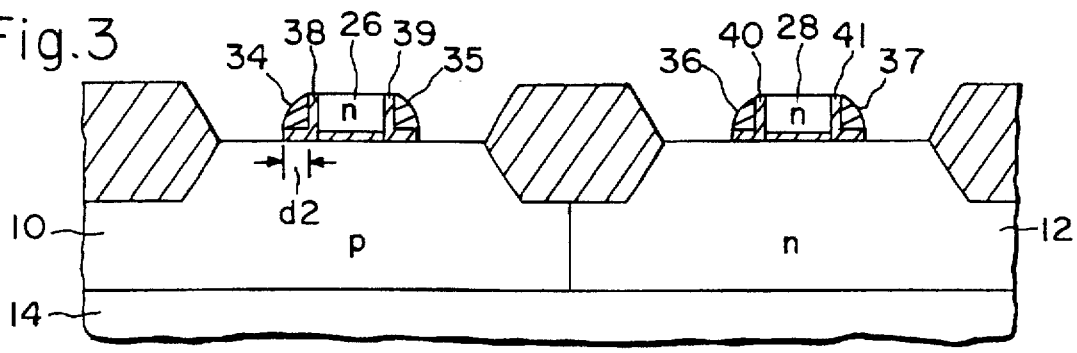

In FIG. 3, the remaining portions of the silicon nitride layer constitute portions 34 and 35 that lie near the respective sides of the gate 26 and portions 36 and 37 that lie near the respective sides of the gate 28. Illustratively, the width d2 at the base of each of these nitride portions is about 200-to-250 nm. Interposed between these nitride portions and the gates are remaining portions of the oxide layer 30 shown in FIG. 2. In FIG. 3, these remaining oxide portions are designated by reference numerals 38 through 41. Together, each adjoining pair of nitride and oxide portions constitutes a gate spacer.

Figure 4:
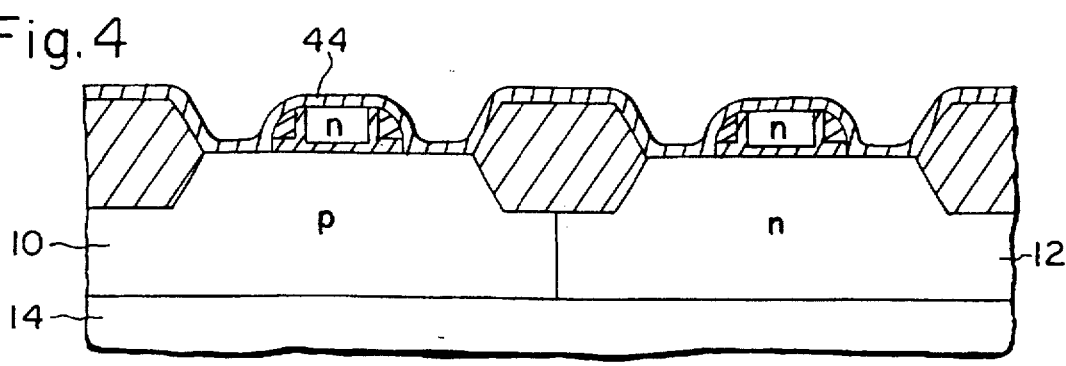

In accordance with the principles of the present invention, a layer 44 of silicon dioxide about 40 nm thick is then deposited on the entire top surface of the structure, as indicated in FIG. 4. Alternatively, for a reason that will be specified later below, the layer 44 can be a deposited bilayer comprising approximately 20 nm of silicon dioxide having an overlying layer of amorphous silicon about 20 nm thick. In either case, the deposited layer 44 is utilized subsequently in the process as a basis for selectively removing the nitride spacers from one but not the other of the gates 26 and 28, as described in detail later below.

Figure 5:
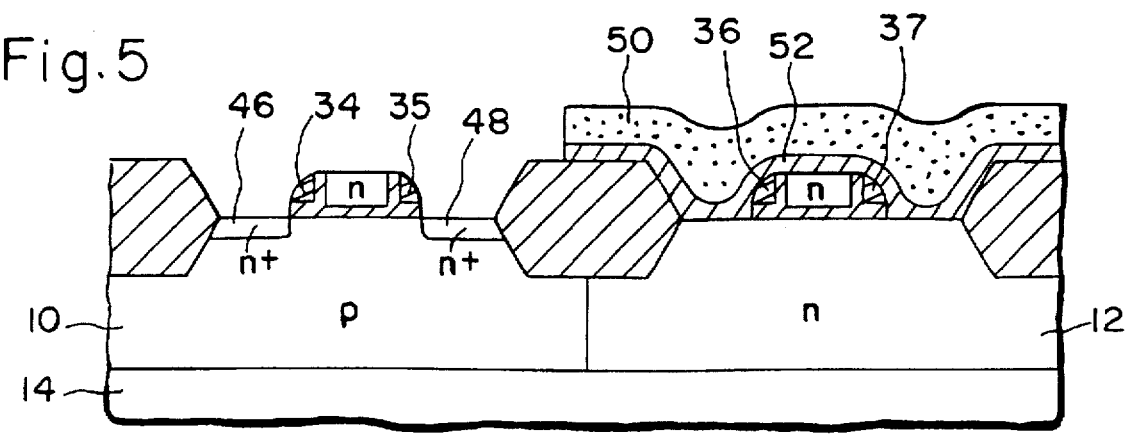

A conventional photoresist mask (the first mask to be used in the described process after forming the FIG. 1 structure) is then employed to cover those regions of the structure in which p-channel transistors are to be formed. Subsequently, those portions of the deposited oxide layer 44 that are not covered with photoresist are removed in, for example, a standard wet etching step utilizing an HF solution. A relatively heavy $n^+$ dose is then implanted into the uncovered surface regions of the p-well 10. By way of example, about $10^{15}$ arsenic ions per centimeter square are implanted therein substantially perpendicular to the surface at an energy of approximately 80,000-to-120,000 electron volts. (All subsequent implants are also carried out substantially perpendicular to the depicted surface.) The $n^-$ regions thereby formed in the p-well 10 are indicated in FIG. 5 wherein they are designated by reference numerals 46 and 48. Further, reference numeral 50 in FIG. 5 identifies the aforementioned photoresist mask. Underlying the mask 50 is the remaining portion 52 of the oxide layer 44.

In a standard $O_2$ plasma, the photoresist mask 50 of FIG. 5 is then etched away. Next, the nitride portions 34 and 35 of the gate spacers are removed. This is done, for example, by immersing the structure in a phosphoric acid bath at about 150 degrees Celsius for approximately 1.5 hours. During this removal step, the portions 36 and 37 are protected by the oxide layer 52 from attack by the hot phosphoric acid. Moreover, the wet etchant utilized to remove the portions 34 and 35 has little effect on exposed polysilicon and silicon surfaces of the structure.

Figure 6:
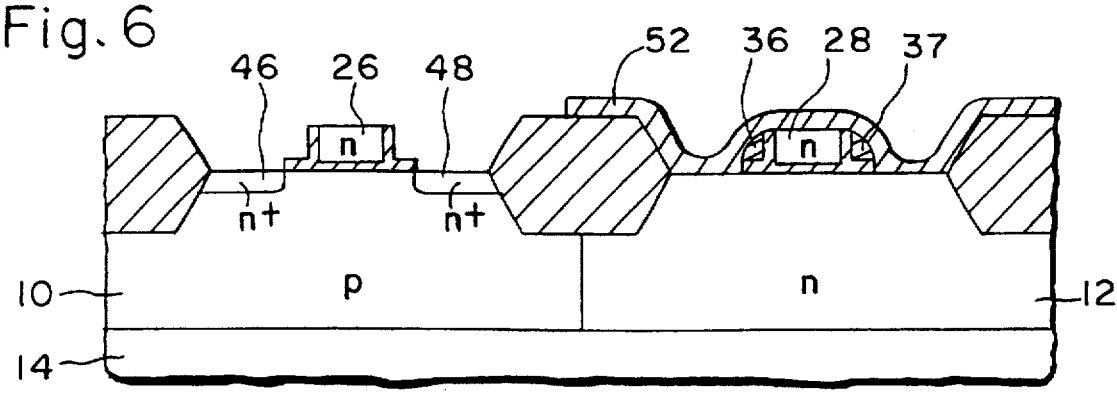

If desired, the resistance of the oxide layer 52 (FIG. 5) to phosphoric acid can be enhanced by first annealing the layer at about 900 degrees Celsius in an oxygen ambient for approximately 30 minutes. Alternatively, enhanced resistance to acid attack can be realized by replacing the oxide layer 52 with an oxide-polysilicon bilayer of the type specified earlier above. If no enhancement is carried out, the thickness of the oxide layer 52 is reduced by the phosphoric acid but in practice remains sufficient to protect the underlying spacers. At that point in the process, the structure appears as shown in FIG. 6.

In accordance with the invention, it is generally advantageous next to carry out an annealing step to remove any implant damage caused by the aforedescribed $n^+$ implant. Since neither $p^+$ nor $n^-$ implants required in the final device have yet been implemented, thermal restrictions on the annealing step are dictated only by threshold implant profile considerations, not by the desired profiles of the later $p^+$ and $n^-$ implants. Thus, an annealing step carried out at this point in the process facilitates achieving shallow and laterally controlled $p^+$ junctions and limiting lateral $n^-$ diffusion in the final device. Illustratively, such annealing is done at about 900-to-920 degrees Celsius for approximately 45-to-90 minutes in a nitrogen atmosphere.

Next, a blanket $n^-$ implant step is performed to form the LDD portion of the n-channel transistors. By way of example, this step comprises implanting about $10^{13}$ phosphorus ions per centimeter square at an energy of approximately 50,000-to-70,000 electron volts. Since the photoresist mask 50 (FIG. 5) was removed earlier, surface portions of the n-well 12 are also thereby implanted with these ions.

Figure 7:
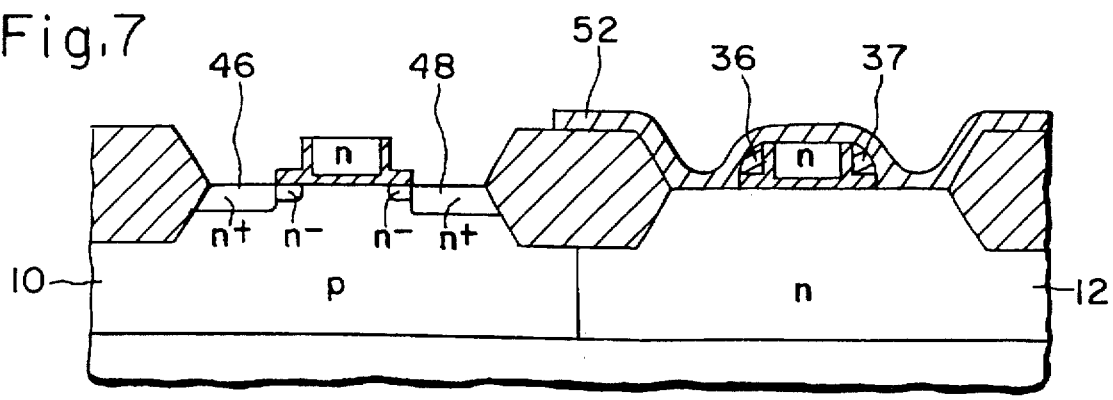

(These regions will be over-compensated later during the p⁺ implant step.) The resulting structure is shown in FIG. 7.

Figure 8:
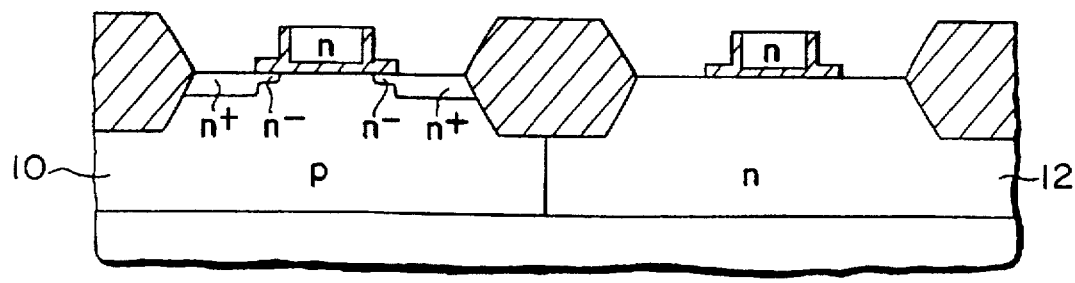

The structure is then immersed in a standard HF solution to remove the oxide layer 52. As is well known in the art, the HF solution attacks the exposed silicon regions 26, 46 and 48 too. However, the phosphoric acid earlier used for removing the nitride portions 34 and 35 already has decreased the thickness of oxide layer 52. Its original thickness of approximately 40 nm may be reduced considerably. The actual decrease can be controlled by the extent of enhancing this oxide layer 52 as has been mentioned above. As a consequence, the immersion in the HF solution may be adjusted in order to last short enough to avoid causing any substantial damage to the silicon regions 26, 46 and 48. Subsequently, the portions 36 and 37 are removed by immersion in a phosphoric acid bath at about 150 degrees Celsius for approximately 1.5 hours. At that point, the structure appears as indicated in FIG. 8.

Figure 9:
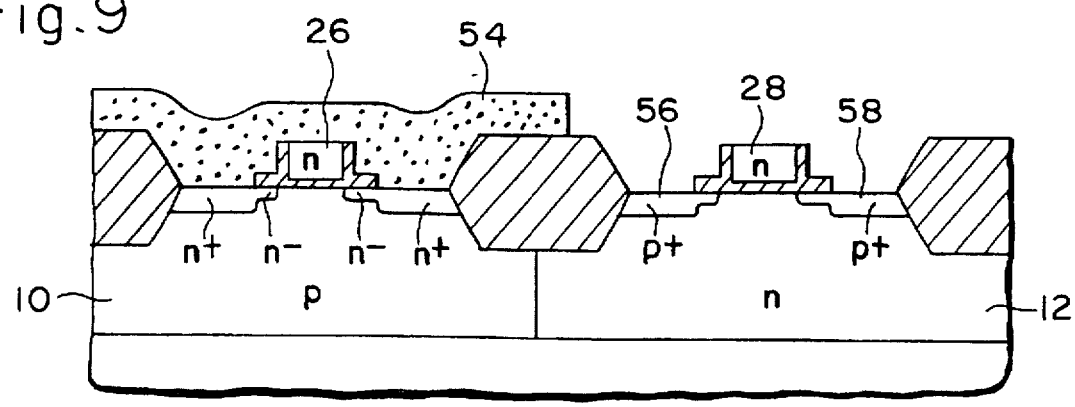

A conventional photoresist mask 54 is then formed overlying p-well portions of the structure, and p⁺ regions 56 and 58 are subsequently implanted, as represented in FIG. 9. Illustratively, implantation involves about $1\text{-to-}2\times10^{15}$ $BF_2$ or boron ions per centimeter square at an energy of approximately 40,000-to-60,000 electron volts. Since the p⁺ dose is at least two orders of magnitude larger than the previously specified n-type implant dose, the surface regions in the n-well 12 are clearly over-compensated by the p⁺ implant.

Next, the photoresist mask 54 is stripped in a standard way in, for example, an $O_2$ plasma. A thermal annealing cycle can then be introduced to anneal any implant damage caused by the n⁻ and p⁺ implants and to ensure proper overlap between the source/drain regions and the gates of both the n- and p-channel transistors. By way of example, such annealing can be carried out at about 900 degrees Celsius for approximately 30 minutes in a nitrogen ambient. If a conventional glass densification step is included later in the fabrication sequence, the aforementioned thermal cycle may not be necessary. In that case, annealing will occur later during the densification step.

Figure 10:
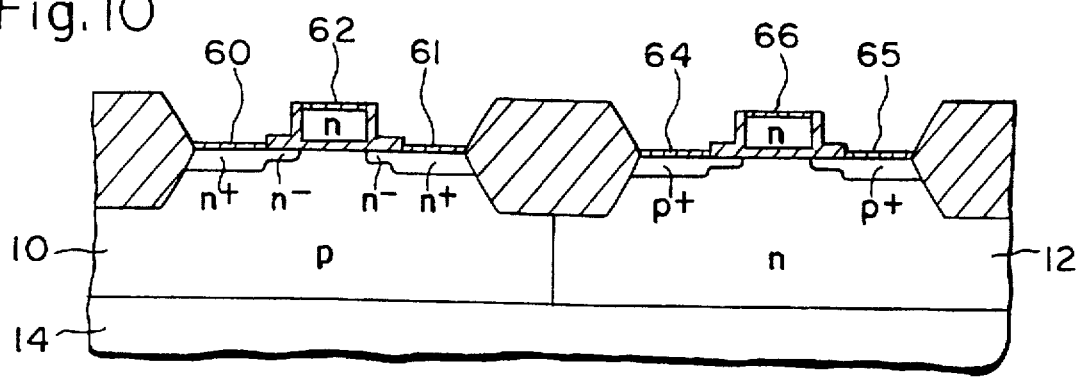

A reactant metal such as cobalt or titanium is then sputtered to, for example, a thickness of about 50 nm on the entire top surface of the structure depicted in FIG. 9. Next, by standard techniques the metal is converted to a silicide wherever the metal overlies exposed silicon or polysilicon surfaces. The remaining unconverted metal overlying other materials is then removed by etching. As a result, self-aligned low-resistance silicide contacts are thereby formed for the drain, source and gate of each of the transistors of the CMOS device. Thus, as shown in FIG. 10, the n-channel transistor includes source, drain and gate silicide contacts 60, 61 and 62, respectively, and the p-channel transistor includes source, drain and gate silicide contacts 64, 65 and 66, respectively.

In some cases, it is advantageous to form sloped-wall spacers made of silicon dioxide alongside the gates 26 and 28 of FIG. 9 before sputtering cobalt or titanium onto the top surface of the structure. Such spacers, which can be made in conventional ways, serve to improve metal coverage later on in the fabrication sequence, as is well known in the art.

Subsequently, other standard steps are carried out to complete the fabrication of the herein-specified CMOS device. These steps include, for example, forming metallic connections to the silicide contacts shown in FIG. 10. Such connections are made, for example, of tungsten and are used as local interconnects or as areas to be contacted from another level of the structure through an overlying dielectric layer (not shown).

In accordance with the invention, two advantageous variants of the above-specified fabrication sequence are feasible. In a first such variant, the layer 44 shown in FIG. 4 comprises a layer of a material such as oxynitride rather than silicon dioxide. Such a layer of oxynitride, which comprises a standard known material made from silicon dioxide and silicon nitride, is deposited to, for example, a thickness of about 20 nm in a conventional LPCVD step. Illustratively, the material is formed to exhibit a refractive index between 1.70 and 1.72, which in effect specifies the oxide/nitride proportions in the material and thereby determines the etch rate of the oxynitride layer in a later processing step. (In that later step, oxynitride or any other standard material selected for the indicated layer must exhibit a relatively high etch selectivity with respect to silicon dioxide.)

In the first variant, a conventional photoresist mask is utilized to cover the portions of the aforementioned oxynitride layer that overlie p-wells in the device structure being fabricated. The uncovered portions of the oxynitride layer are then removed in, for example, a standard wet chemical etching step utilizing hot phosphoric acid. P⁺ dopant is then introduced into exposed surface regions of the n-wells. This is done, for example, in a step that involves implanting about $1\text{-to-}2\times10^{15}$ $BF_2$ or boron ions per centimeter square at an energy of approximately 40,000-to-60,000 electron volts.

Figure 11:
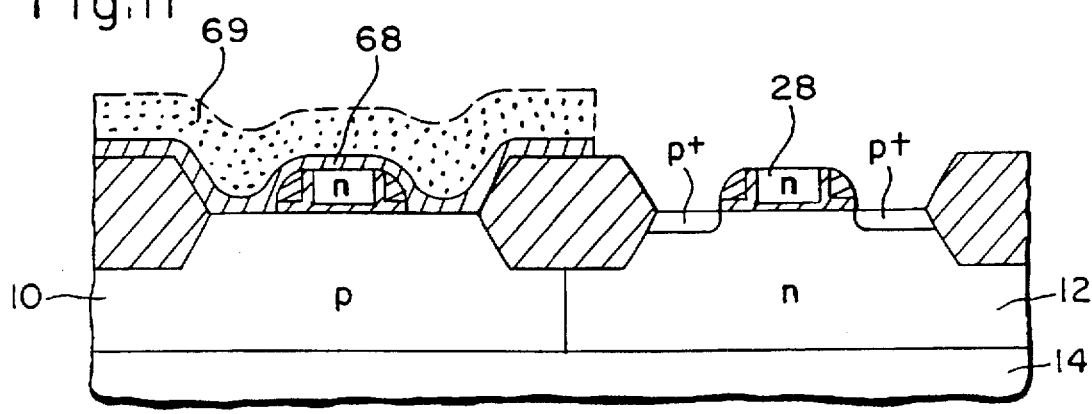
FIGS. 11 through 13 each illustrate steps in a fabrication sequence that is a variant of the sequence represented in FIGS. 1 through 10.

The aforementioned photoresist mask is then removed utilizing, for example, an $O_2$ plasma. At that point, the structure appears as shown in FIG. 11 wherein the remaining portion of the noted oxynitride layer is designated by reference numeral 68. (In FIG. 11, the removed photoresist mask is shown in dashed outline and is designated by reference numeral 69.)

Next, a relatively thick layer of thermally grown silicon dioxide is formed to a thickness of, for example, about 50-to-60 nm on the surface of the silicon n-well 12 and on the surface of the polysilicon gate 28. Illustratively, this growth step is carried out at a temperature of about 900 degrees Celsius for approximately 30 minutes in an oxygen ambient. In practice, a thin layer of oxide less than about 10 nm thick is also thereby usually unavoidably formed on the oxynitride layer 68.

Immersion of the described structure in a standard 10:1 HF solution for about 30 seconds is effective to remove the thin oxide layer from the oxynitride layer. The underlying oxynitride layer is then removed by, for example, immersing the structure in hot phosphoric acid for about 10 minutes.

A blanket n⁺-type implant is then introduced into surface regions of the p-wells. By way of example, this implant step involves a concentration of about $5\text{-to-}7\times10^{15}$ arsenic ions per centimeter square at an energy of approximately 100,000-to-120,000 electron volts. At that point in the fabrication cycle of the first variant, the structure appears as shown in FIG. 12.

Figure 12:
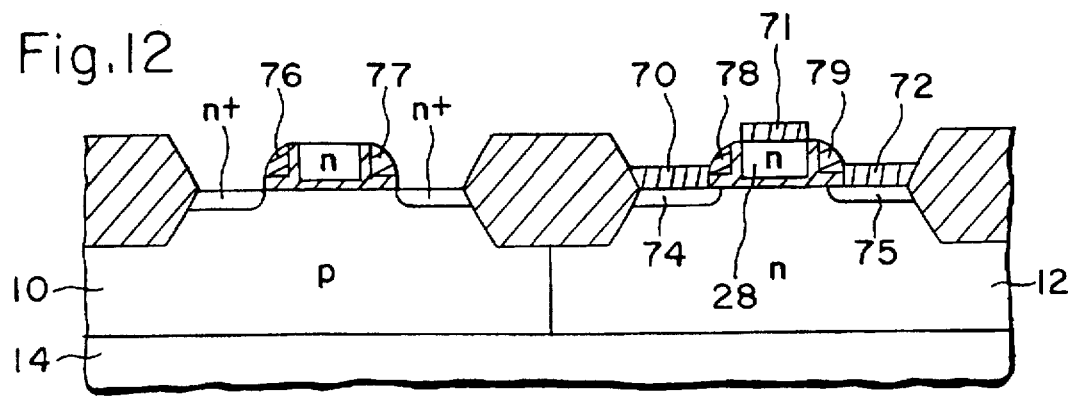

The aforedescribed relatively thick grown oxide layers are represented in FIG. 12 by reference numerals 70 through 72. The layers 70 through 72 are sufficiently thick to allow only a small amount (less than one percent) of the aforespecified arsenic ions directed at the structure from penetrating into the depicted p⁺ regions 74 and 75 and the gate 28.

The oxide layers 70 through 72 are then removed from the FIG. 12 structure. This is done, for example, in a standard wet chemical etching step utilizing HF.

The portions 76 through 79 made of silicon nitride are then removed from the FIG. 12 structure. This is done, for example, by immersion in hot phosphoric acid, as in the first-described process set out earlier above.

Any damage caused by the priorly described implantation steps is then annealed. By way of example, this is done by annealing at about 900-to-920 degrees Celsius for approximately 30-to-60 minutes in a nitrogen ambient.

Figure 13:
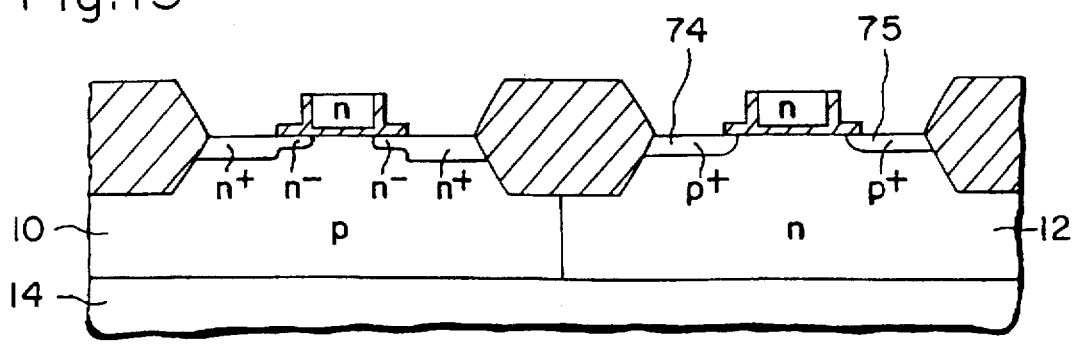

Next, a blanket n⁻ implant step is carried out. Illustratively, this involves an implant concentration of about 10¹³ phosphorus ions per centimeter square at an energy of approximately 50,000-to-70,000 electron volts. Such a relatively light dose does not in practice deleteriously affect the resistivity of the previously formed p⁺ regions 74 and 75. At that point, the structure appears as shown in FIG. 13. Significantly, only a single masking step (after forming the FIG. 1 structure) is required to achieve such a structure. In subsequent standard steps, the structure is further processed in conventional ways to form a complete CMOS device.

In a second variant of the first-described fabrication process, the photoresist mask described above in connection with the description of the first variant is formed on the oxynitride layer overlying the n-wells of the structure. Accordingly, in the second variant the n⁺-implant step is carried out before the p⁺ implant. The fabrication sequence for the second variant is otherwise a straightforward analog of the first-variant process described in detail above. Again, it is significant that only a single masking step is required to form the structure shown in FIG. 13.

Finally, it is to be understood that the above-described procedures and arrangements are only illustrative of the principles of the present invention. In accordance with these principles, numerous modifications and alternatives may be devised by those skilled in the art without departing from the spirit and scope of the invention.

What is claimed is:

1. A method of fabricating a CMOS device of the LDD type in a semiconductor wafer comprising the steps of
   (a) forming polysilicon gates (26; 28) overlying first (10) and second (12) conductivity type semiconductor regions in said wafer (14),
   (b) forming spacers (34,38; 35,39; 36, 40; 37, 41) along the sides of the gates by growing a layer of silicon oxide (30) on the gates and semiconductor regions, depositing a further layer of silicon nitride (32) on the silicon oxide layer and performing an anisotropic etch step to form oxide and nitride positions,
   (c) forming a mask (50, 52) comprising a first protective layer of silicon oxide (52) and a second overlying resist layer (50) to cover gate-spacer structures (28; 34,38; 35, 39) overlying the regions (12) of the first conductivity type (n) in which source/drain regions are to be formed and to leave uncovered gate-spacer structures (26; 34, 38; 35, 39) overlying the regions (10) of the second conductivity type (p) in which source/drain regions are to be formed,
   (d) implanting exposed surface portions of the regions (10) of the second conductivity type (p) with dopant of said first conductivity type (n),
   (e) removing the second overlying resist layer (50) from the mask (52, 50),
   (f) removing with the first protective layer (52) of the mask (52, 50) still in place, nitride portions (34, 35) from the gate (26) in the regions (10) of the second conductivity type (p) and
   (g) performing a blanket implant of dopant of said first conductivity type (n) to form the LDD regions.

2. The method of claim 1 further comprising the steps of
   (h) forming a mask to cover the gate, the oxide portions, and exposed surface portions of the regions of the second conductivity type (p), and
   (i) implanting exposed surface portions of the regions of the first (n) conductivity type (n) with dopant of said second conductivity type (p).

3. A method of fabricating a CMOS device of the LDD type in a semiconductor wafer comprising the steps of
   (a) forming polysilicon gates overlying first and second conductivity type semiconductor regions in said wafer,
   (b) forming spacers along the sides of the gates by growing a layer of silicon oxide on the gates and semiconductor regions, depositing a further layer of silicon nitride on the silicon oxide layer and performing an anisotropic etch step to form oxide and nitride portions,
   (c) forming a mask comprising a first protective layer of silicon oxynitride and a second overlying resist layer to cover gate-spacer structures overlying the regions of the second conductivity type in which source/drain regions are to be formed and to leave uncovered gate-spacer structures overlying the regions of the first conductivity type in which source/drain regions are to be formed,
   (d) implanting exposed surface portions of the regions of the first conductivity type with dopant of said second conductivity type,
   (e) removing the second overlying resist layer from the mask,
   (f) growing a further layer of silicon dioxide on exposed polysilicon surfaces of the gate-spacer structures and on exposed surface portions of the regions of the first conductivity type to block subsequent implantation of dopant of the first conductivity type,
   (g) removing the first protective layer of the mask, and
   (h) performing a blanket implant of dopant of said first conductivity type to form heavily-doped source and drain regions of the first conductivity type in regions of the second conductivity type.

4. The method of claim 3 further comprising the steps of
   (i) removing the further layer of silicon dioxide in the regions of the first conductivity type,
   (j) removing nitride portions from the gates in the regions of the first conductivity type and in the regions of the second conductivity type, and
   (k) performing a blanket implant of dopant of said first conductivity type to form the LDD regions.

5. The method of claims 1 or 3 in which the first conductivity type is n-type and the second conductivity type is p-type.

6. The method of claims 1 or 3, wherein each spacer is selectively removable with respect to the gate.